(12) United States Patent
Shah et al.

(10) Patent No.: US 10,237,658 B2
(45) Date of Patent: Mar. 19, 2019

(54) PLUG TYPE DETECTION

(75) Inventors: Peter J. Shah, San Diego, CA (US); Arash Mehrabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1023 days.

(21) Appl. No.: 13/554,115

(22) Filed: Jul. 20, 2012

(65) Prior Publication Data

US 2013/0158919 A1    Jun. 20, 2013

Related U.S. Application Data

(60) Provisional application No. 61/576,887, filed on Dec. 16, 2011, provisional application No. 61/576,868, filed on Dec. 16, 2011.

(51) Int. Cl.
*H04R 1/10* (2006.01)
*G01R 31/04* (2006.01)
*H04R 5/04* (2006.01)

(52) U.S. Cl.
CPC .............. *H04R 5/04* (2013.01); *G01R 31/041* (2013.01); *G01R 31/043* (2013.01); *H04R 1/1033* (2013.01); *H04R 2420/09* (2013.01)

(58) Field of Classification Search
CPC ..... H04R 5/04; H04R 1/1033; H04R 2420/09
USPC ........................................................ 702/64
See application file for complete search history.

(56) References Cited

U.S. PATENT DOCUMENTS

| | | | |
|---|---|---|---|
| 5,910,991 A | 6/1999 | Farrar | |
| 5,917,916 A | 6/1999 | Sibbald et al. | |
| 6,069,960 A | 5/2000 | Mizukami et al. | |
| 6,122,369 A | 9/2000 | Hwang et al. | |
| 6,397,087 B1 | 5/2002 | Kim et al. | |
| 6,984,990 B2 | 1/2006 | Shin | |

(Continued)

FOREIGN PATENT DOCUMENTS

| | | |
|---|---|---|
| CN | 101211650 A | 7/2008 |
| CN | 101431708 A | 5/2009 |

(Continued)

OTHER PUBLICATIONS

TI Application Report SLAA454—Jun. 2010 Headset Detection for TLV320AIC33 and TLV320AIC3101/4/5/6 Family, pp. 1-21.

(Continued)

*Primary Examiner* — Stephanie E Bloss
(74) *Attorney, Agent, or Firm* — Patterson & Sheridan, L.L.P. Qualcomm (57) ABSTRACT

Techniques for detecting the type of a media plug inserted into a corresponding jack. In an exemplary embodiment, the output of a first power amplifier for driving a media plug terminal, e.g., the right headphone or left headphone, is selectively coupled to a reference voltage. Measurements of the voltage at a microphone terminal of the media plug may be alternately made for the reference voltage being at a first value and a second value. In an embodiment, the first power amplifier output voltage may be varied by opening or closing a switch. Alternatively, the first power amplifier output voltage may be directly set by an input voltage to the first power amplifier. By detecting changes in the voltages measured at the microphone terminal, it may be determined whether the media plug is of a North American type or European type.

19 Claims, 8 Drawing Sheets

(56) References Cited

U.S. PATENT DOCUMENTS

| | | | |
|---|---|---|---|
| 8,280,038 B2 | 10/2012 | Johnson et al. | |
| 8,565,444 B2 | 10/2013 | Johnson | |
| 9,210,500 B2* | 12/2015 | Allen | H04R 3/00 |
| 2008/0130911 A1* | 6/2008 | Tsen | H04R 5/04 |
| | | | 381/74 |
| 2008/0164994 A1 | 7/2008 | Johnson et al. | |
| 2009/0130910 A1 | 5/2009 | Inha et al. | |
| 2009/0227298 A1 | 9/2009 | Fukunaga | |
| 2010/0215183 A1 | 8/2010 | Hansson et al. | |
| 2011/0099298 A1 | 4/2011 | Chadbourne et al. | |
| 2011/0128019 A1 | 6/2011 | Saito | |
| 2011/0150234 A1 | 6/2011 | Johnson et al. | |
| 2011/0216912 A1 | 9/2011 | Seo | |
| 2012/0263313 A1* | 10/2012 | Yu | H01R 24/58 |
| | | | 381/74 |
| 2013/0156216 A1 | 6/2013 | Shah et al. | |

FOREIGN PATENT DOCUMENTS

| | | |
|---|---|---|
| CN | 101719610 A | 6/2010 |
| JP | 2009218843 A | 9/2009 |
| JP | 2011114660 A | 6/2011 |
| WO | 2006045617 A2 | 5/2006 |
| WO | 2011079720 A1 | 7/2011 |

OTHER PUBLICATIONS

Fairchild Semiconductor, "Audio Jack Detection and Configuration, MIC / GND Cross Point Switch," FSA8049, Oct. 2011, pp. 6-8.
International Search Report and Written Opinion—PCT/US2012/070193—ISA/EPO—dated Mar. 19, 2013.

* cited by examiner

FIG 1A

North American Type Plug

European Type Plug

FIG 7

PLUG TYPE DETECTION

RELATED APPLICATIONS

This application claims priority to U.S. Provisional Pat. App. Ser. No. 61/576,868, entitled "Plug Insertion Detection," filed Dec. 16, 2011, and to U.S. Provisional Pat. App. Ser. No. 61/576,887, entitled "Plug Type Detection," filed Dec. 16, 2011, both assigned to the assignee of the present disclosure, the contents of which are hereby incorporated by reference herein in their entirety.

BACKGROUND

Field

The disclosure relates to audio and other media devices, and, in particular, to techniques for automatically detecting the type of a media plug inserted into a corresponding jack.

Background

Audio and other media devices often include a jack for receiving a media plug coupled to a peripheral device. For example, a mobile phone may include a jack for receiving a plug coupled to an audio headset with microphone, which allows a user to carry on a voice conversation over the mobile phone using the headset. Other example media devices include MP3 players, notebook computers, personal digital assistants, etc., while other peripheral devices include personal computer speakers, home entertainment stereo speakers, etc.

Audio plugs are commonly available in at least two types of configurations: a North American type (including microphone, ground, right channel, and left channel terminals in sequence) and a European type (including ground, microphone, right channel, and left channel terminals in sequence). The sizes of these two plug types may be the same, but the sequences of electrical terminals on the plugs are different. When a user first plugs the audio plug into a jack of the media device, he or she may not have knowledge of the plug type. Furthermore, the media device itself may not have other means to determine a priori the type of plug inserted.

It would be desirable to provide efficient and reliable techniques for allowing the media device to automatically determine the type of plug inserted into the jack.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1A:
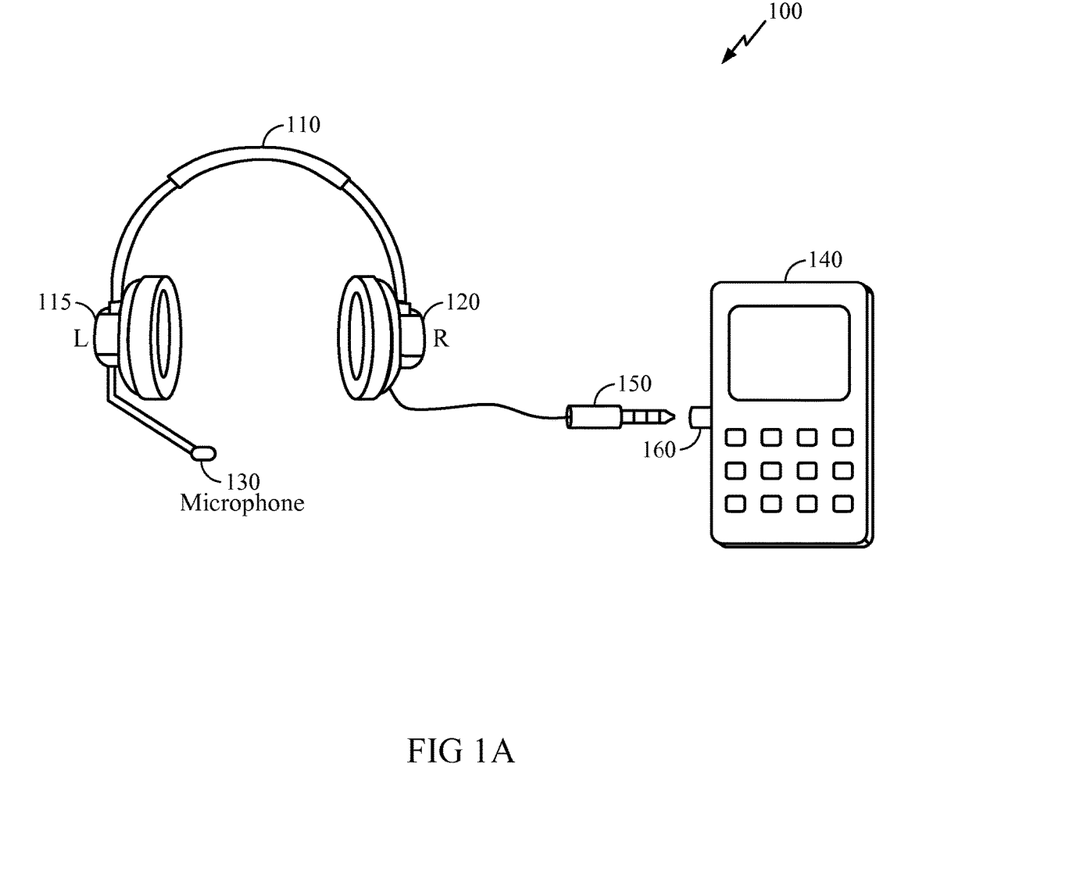
FIG. 1A illustrates an exemplary scenario wherein the techniques of the present disclosure may be applied.

FIG. 1A illustrates an exemplary scenario 100 wherein the techniques of the present disclosure may be applied. It will be appreciated that FIG. 1A is shown for illustrative purposes only, and is not meant to limit the scope of the present disclosure to the particular system shown. For example, it will be appreciated that the techniques disclosed herein may also be readily applied to audio, media, and/or peripheral devices other than those shown. The techniques may be readily adapted to other types of multi-media devices, as well as to non-audio media devices, e.g., accommodating type detection of plugs inserted into a video device. Such alternative exemplary embodiments are contemplated to be within the scope of the present disclosure.

In FIG. 1A, a headset 110 includes a left (L) headphone 115, a right (R) headphone 120, and a microphone 130. These components are electrically coupled to terminals of a plug 150, which is insertable into a jack 160 of an audio device 140. The device 140 may be, for example, a mobile phone, MP3 player, home stereo system, etc. Electrical signals having audio and/or other content may be exchanged between the device 140 and the headset 110 through the plug 150 and jack 160. In general, the headset 110 including the plug 150 may be detachable from the device 140 by the user.

The plug 150 may receive signals from the jack 160, and route the appropriate signals to the L and R headphones of the headset 110. The plug 150 may further couple an electrical signal with audio content generated by the microphone 130 to the jack 160 for further processing by the device 140. Note the plug 150 and jack 160 may include further terminals not shown, e.g., for communicating other types of signals such as control signals, etc.

Figure 1B:
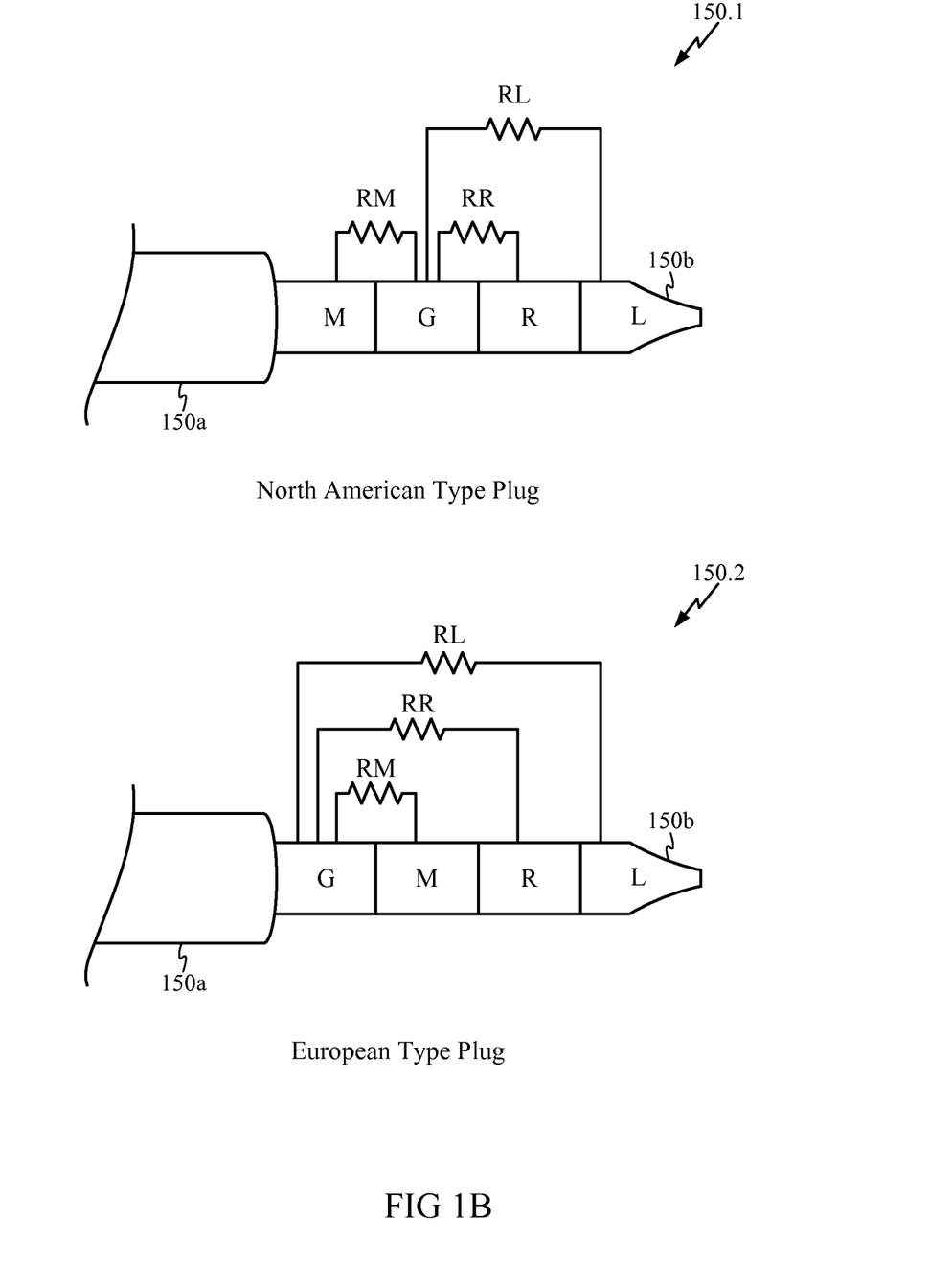
FIG. 1B illustrates two exemplary types of audio plugs that may be detected according to the techniques of the present disclosure.

FIG. 1B illustrates two exemplary types of audio plugs that may be detected according to the techniques of the present disclosure. Note the plug types in FIG. 1B are shown for illustrative purposes only, and are not meant to limit the scope of the present disclosure to any particular plug types. The techniques of the present disclosure may readily be adapted to distinguish between other plug types having alternative physical dimensions, and such alternative exemplary embodiments are contemplated to be within the scope of the present disclosure.

In FIG. 1B, the terminals of a North American type plug 150.1 include microphone (M), ground (G), right (R) headphone, and left (L) headphone terminals, in sequence from the base 150a of the plug to the tip 150b. An effective load resistance RM is present between the M and G terminals of the plug 150.1, corresponding to the effective impedance of the microphone 130 of the headset 110. Furthermore, the right headphone 120 presents an effective load resistance RR between the R and G terminals, and the left headphone 115 presents an effective load resistance RL between the L and G terminals. The terminals of a European type plug 150.2 include G, M, R, and L terminals, in sequence from the base 150a to the tip 150b. Similar effective resistances RM, RR, and RL are presented to the terminals of the European type plug 150.2 by the microphone, R headphone, and L headphone loads, respectively.

Note the M, G, R, and L terminals of both types of plugs are electrically coupled to corresponding components of the headset 110 as illustrated in FIG. 1, with the G terminal of each of the plug types 150.1, 150.2 being coupled to a common ground connection (not shown in FIG. 1) in the headset 110. It will be appreciated that the plugs 150.1 and 150.2 may have common sizes and physical features, except that the terminals G and M are reversed in position between the two types of plugs.

In general, when a user of the device 140 inserts a plug 150 of a headset 110 into the device 140, the device 140 may not have the means to determine a priori the type of the plug inserted. It would be desirable to provide techniques for allowing the device 140 to automatically detect the plug type, and to process signals to and from the plug 150 accordingly.

Figure 2:
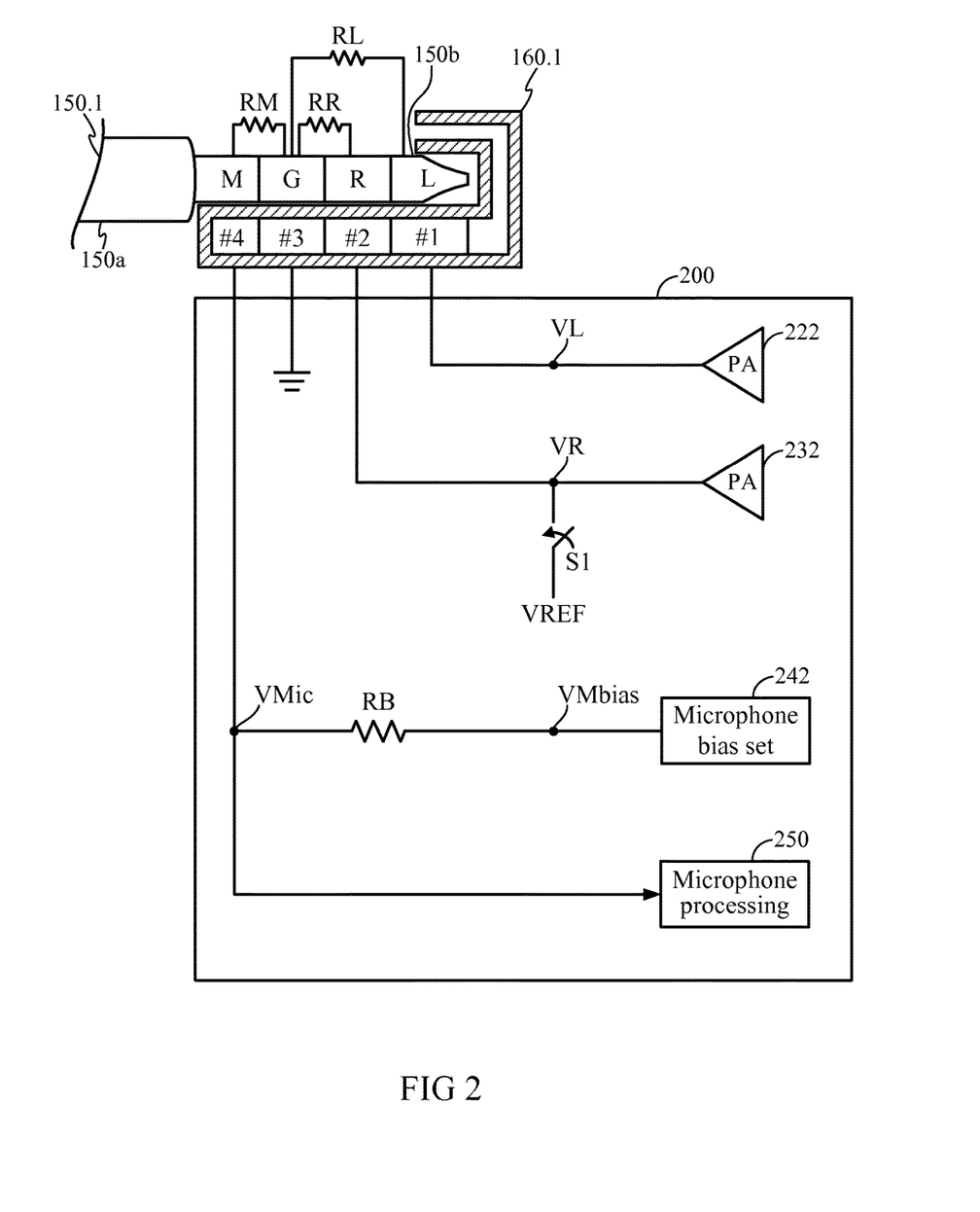
FIGS. 2 and 3 illustrate an exemplary embodiment of a plug type detection system according to the present disclosure.
Figure 3:
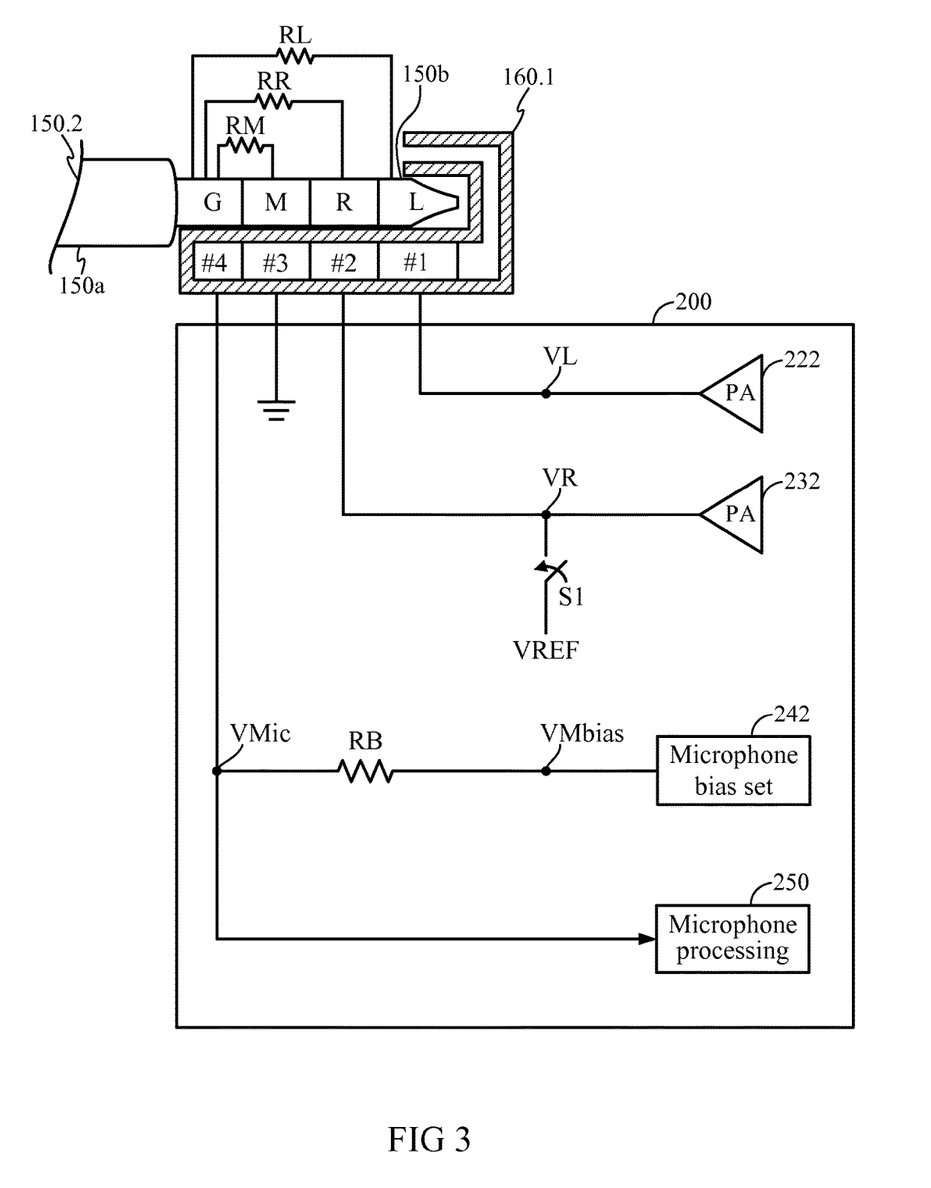

According to the present disclosure, techniques are provided for allowing the device 140 to detect the type of the plug 150 inserted into the jack 160. FIGS. 2 and 3 illustrate an exemplary embodiment of a plug type detection system 200 according to the present disclosure. The plug type detection system 200 may be provided in the device 140 of FIG. 1.

In FIG. 2, a North American type plug 150.1 is shown fully inserted into a jack 160.1. The terminals of the plug 150.1 are electrically engaged with corresponding terminals on the jack 160.1. In particular, jack 160.1 includes terminals #1, #2, #3, and #4, that are electrically engaged with the L, R, G, and M terminals, respectively, of the fully inserted plug 150.1. The terminals of the jack 160.1 electrically couple the terminals of the plug 150.1 to various other nodes (not shown) of the device 140, which processes signals to and from the headset 110.

In FIG. 2, the L terminal of the plug 150.1 is coupled through terminal #1 of the jack 160.1 to the output of a power amplifier (PA) 222, which may drive the L headphone with a voltage VL. Similarly, the R terminal of the plug 150.1 is coupled through terminal #2 of the jack 160.1 to the output of a power amplifier (PA) 232, which may drive the R headphone with a voltage VR. It will be appreciated that the power amplifiers 222 and 232 may drive the left and right headphones (or speakers) with an audio signal, e.g., voice, music, etc. The inputs to the power amplifiers 222, 232 may be driven by an appropriate audio signal generator (not shown in FIG. 2). In an exemplary embodiment, the outputs of the PA's 222 and 232 may further be selectively configured to be high impedance nodes using one or more control signals (not shown in FIG. 2). For example, the PA's 222 and 232 may be configured to generate high impedance outputs if they are not called upon to drive the respective headphones, such as when the plug 150.1 is not fully plugged into the jack 160.1, and/or during an initial phase wherein the plug type is being determined, as further described hereinbelow.

In FIG. 2, terminal #4 of the jack 160.1 is coupled via a bias resistance RB to a microphone bias set block 242, which may generate a DC bias voltage VMbias for biasing the microphone coupled to terminal #4. Terminal #4 may further be coupled to a microphone processing block 250, which detects and processes a voltage VMic coupled to the M terminal. It will be appreciated that the voltage VMic is electrically coupled, through the M terminal of the plug 150.1, to the signal generated by the microphone 130 in response to acoustic signals detected at the microphone input. The microphone processing block 250 receives the voltage VMic as input, and may perform further processing to recover the acoustic signal from VMic. In certain exemplary embodiments, a coupling capacitor (not shown) may be provided between VMic and the microphone processing block 250 for AC coupling.

In FIG. 2, a switch S1 is provided at the output of the PA 232 driving terminal #2, or the R terminal. The switch S1 may selectively couple the output of the PA 232 to a reference voltage VREF, in response to, e.g., a separately provided control signal (not shown). In an exemplary embodiment, VREF may correspond to, e.g., ground.

Operation of the type detection system 200 will now be described herein with reference to two states: a non-inserted state (not shown in FIG. 2) wherein the plug is not inserted into the jack, and an inserted state (shown in FIG. 2) wherein the plug is inserted into the jack. In the non-inserted state, the output of the PA 232 is configured to have high impedance. During an initial phase of the inserted state, the output of the PA 232 is still configured to have high impedance, while the switch S1 is alternately configured to be closed, and then opened (or alternatively, opened, and then closed). A first measurement VMic(1) is made of the voltage VMic when S1 is open, and a second measurement VMic(2) is made when S1 is closed.

Note in this disclosure and in the claims, the descriptive term "first" may designate the measurement of a voltage corresponding to when S1 is open, while the term "second" may designate the measurement corresponding to when S1 is closed. However, such designation of "first" and "second" is for identification purposes only, and is not mean to imply that the switch is necessarily opened before being closed.

Note for a North American type plug 150.1, the voltage VMic will generally result from the series division of the voltage VMbias by the resistances RB and RM, regardless of how the switch S1 is configured. (As the outputs of PA 222 and 232 are configured to have high impedance during the measurement, they are not expected to affect VMic.) Thus the configuration of the switch S1 should not directly affect the measured voltage VMic. In particular, in a North American type plug, terminal #2 of the jack 160.1 is coupled to terminal #3, or ground, via the right headphone (R) load RL. Terminal #4, on the other hand, is independently coupled to ground via the microphone load RM. As VMic at terminal #4 is coupled to ground through a path independent from the path coupled to S1, the configuration at S1 is not expected to affect the measurement of VMic.

In light of this observation, if it is determined that the voltages VMic(1) and VMic(2) measured by the microphone processing block 250 are not significantly different from each other, then such a result would be consistent with the plug 150.1 being a North American type plug.

In FIG. 3, a European type plug 150.2 is next shown inserted into the jack 160.1. The same procedure described with reference to FIG. 2 may be re-applied in this case. In particular, upon detection of plug insertion by the device 140, the switch S1 is alternately configured to be closed, and then opened (or alternatively, opened, and then closed). For each configuration of the switch S1, the microphone processing block 250 measures the corresponding voltage VMic, to derive the measurements VMic(1) and VMic(2).

For a European type plug 150.2 as illustrated in FIG. 3, it will be appreciated that the configuration of the switch S1 is expected to affect the measured voltage VMic. In particular, when S1 is opened, terminal #4 of the jack 160.1 is coupled to terminal #3 via RM, to terminal #2 via RR, and to terminal #1 via RL. The measurement VMic(1) of VMic will thus result from the series division of VMbias by RB and RM, as terminals #2 and #1 are high impedance nodes.

On the other hand, when S1 is closed, then terminal #4 is further coupled to the reference voltage VREF via RR, terminal #2, and S1. In this case, the measurement VMic(2) will result from the division of VMbias by RB in series with the parallel combination of RM and RR. If VREF is chosen appropriately, then there will be a substantial difference between VMic(2) and VMic(1).

In particular, in an exemplary embodiment, the reference voltage VREF may be chosen to correspond to ground. In this case, the path from VMic to ground corresponds to the parallel combination of RR and RM, when S1 is closed. Assuming the impedance of the right headphone is much lower than the impedance of the microphone, then RR is much less than RM. Thus, the voltage at VMic would be reduced substantially, compared to when S1 is opened. In other words, VMic(2)<VMic(1). In an exemplary embodiment, RR may be on the order of Ohms, while RB and RM may both be on the order of kiloOhms, and thus VMic may be close to the ground voltage.

In an exemplary embodiment, the measurements VMic(1) and VMic(2) may be compared to each other, and the plug type may be determined based on whether VMic(1) and VMic(2) are substantially different from each other, e.g., by a predetermined amount. In an alternative exemplary embodiment, a single measurement of VMic when S1 is closed may be used as an indication of the plug type. In particular, if VREF is chosen as ground, then VMic being measured as close to ground when S1 is closed would indicate a European type plug, while VMic being measured as substantially higher than ground when S1 is closed would indicate a North American type plug. For example, a predetermined voltage threshold VTH may be chosen, and the plug type may be indicated to be European if VMic>VTH, and to be North American otherwise. Such alternative exemplary embodiments are contemplated to be within the scope of the present disclosure.

Note while exemplary embodiments are described wherein VREF corresponds to ground, one of ordinary skill in the art will appreciate that VREF may be alternatively chosen, e.g., as a DC voltage other than ground, that also functions to distinguish the plug types from each other. Such alternative exemplary embodiments are contemplated to be within the scope of the present disclosure.

One of ordinary skill in the art will appreciate that the various functionality described, e.g., configuring the switch S1, comparing the voltages VMic(1) and VMic(2), and further determining whether the plug type is North American or European therefrom, etc., may be implemented separately from the functional blocks illustrated in FIGS. 2 and 3. For example, a processing block (not shown) including a comparator, memory elements for storing the measurements VMic(1) and VMic(2) (if necessary), timing elements for controlling the switch S1, etc., may be separately provided. Alternatively, appropriate elements for implementing the functions described herein may be built into the existing blocks as shown in FIGS. 2 and 3. For example, the microphone processing block 250 may be provided with circuitry to store and compare the measured voltages VMic(1) and VMic(2). In an exemplary embodiment, the system 200 may be provided on a single integrated circuit in which the audio processing circuitry is also provided. Such exemplary embodiments represent alternative design choices that may be readily made by one of ordinary skill in the art in light of the disclosure herein, and are contemplated to be within the scope of the present disclosure.

Note FIGS. 2 and 3 illustrate the scenario wherein either a North American type plug 150.1 or European type plug 150.2 is plugged into a system 200 (including, e.g., a jack and/or board) for driving a North American type plug, since the microphone bias set block 242 is coupled to terminal #4 of the jack 160.1, as would be consistent with a North American type plug. One of ordinary skill in the art will appreciate that the same techniques may be applied to a system for driving a European type plug, e.g., wherein the microphone bias set block 242 is coupled to terminal #3 of the jack 160.1. Such alternative exemplary embodiments are contemplated to be within the scope of the present disclosure.

In an exemplary embodiment, once the plug type has been determined according to the techniques described hereinabove, the switch S1 may subsequently be opened to allow the power amplifier 232 to drive terminal #2 of the jack 160.1, coupled to the R headphone 120 of the headset 110, during normal operation. While an exemplary embodiment has been disclosed hereinabove with the switch S1 selectively coupling the terminal associated with the R headphone to a reference voltage VREF, it will be appreciated that alternative exemplary embodiments may alternatively, or in conjunction, incorporate a switch selectively coupling the L headphone (e.g., the output of PA 222 in FIGS. 2 and 3) to a reference voltage. In alternative exemplary embodiments, the right and/or left terminal may be selectively shorted to any low-impedance source or network to determine the plug type. Such alternative exemplary embodiments are contemplated to be within the scope of the present disclosure.

It will be appreciated that following detection of plug type, a processing block (not shown) may take alternative actions depending on whether the plug type is North American or European. For example, a switching network (not shown) may be configured to re-route the terminals of a European type plug to correspond to the terminals of a North American type plug for further processing, etc. Alternatively, or in conjunction, the device 140 may indicate to the user that a wrong plug type was inserted. Such alternative exemplary embodiments are contemplated to be within the scope of the present disclosure.

While specific types of audio plugs 150.1 and 150.2 are shown in FIGS. 2 and 3 for illustrative purposes, it will be appreciated that other types of plugs may also utilize the techniques of the present disclosure. For example, the techniques described herein may readily be modified by one of ordinary skill in the art to detect insertion of a plug with alternative terminals from the ones shown, e.g., video plugs, a plug having only G, M, and headphone terminals (e.g., a monaural plug), or any other types of plugs. Such alternative exemplary embodiments are contemplated to be within the scope of the present disclosure.

Figure 4:
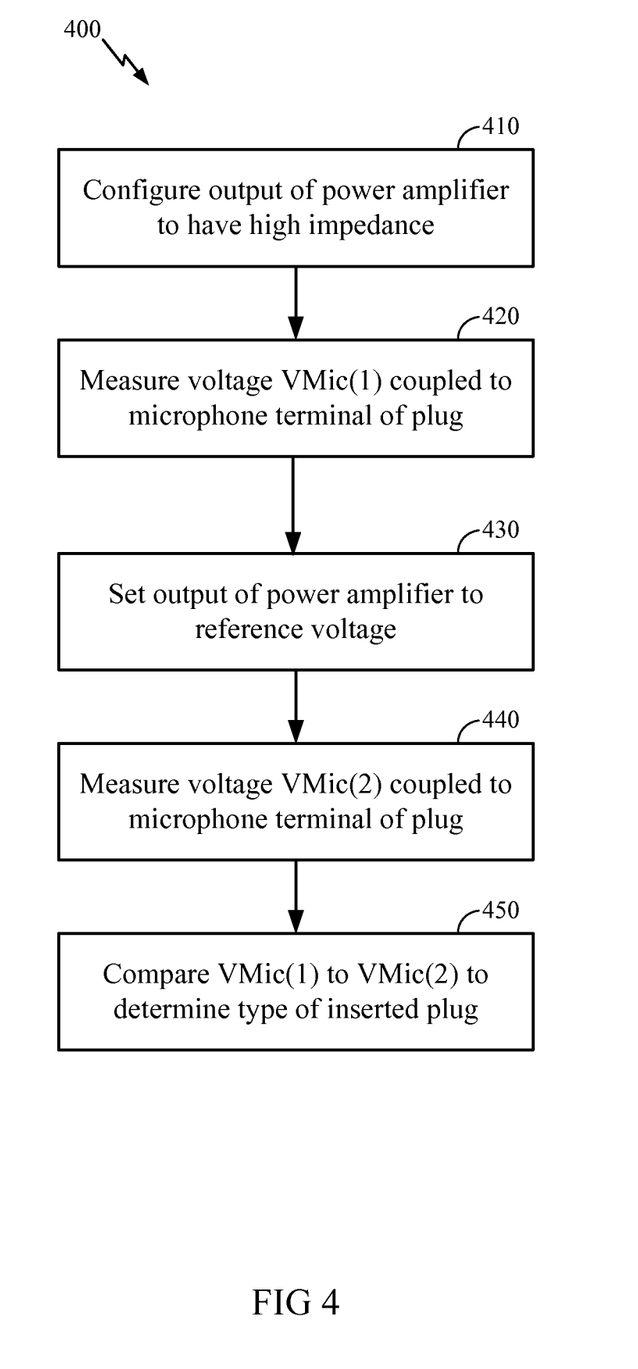
FIG. 4 illustrates an exemplary embodiment of a method for determining plug type according to the present disclosure.

FIG. 4 illustrates an exemplary embodiment of a method 400 for determining plug type according to the present disclosure. Note FIG. 4 is described for illustrative purposes only, and is not meant to limit the scope of the present disclosure to any particular method.

In FIG. 4, at block 410, the output of a power amplifier is configured to have high impedance. Note the power amplifier may be that driving the left headphone or right headphone as described with reference to FIGS. 2 and 3. At block 420, a first measurement VMic(1) of the voltage VMic coupled to the microphone terminal of the plug 150 is measured by the microphone processing block 250. At block 430, the output of the power amplifier is set to a reference voltage. At block 440, a second measurement VMic(2) of the voltage VMic is measured. At block 450, VMic(1) is compared to VMic(2) to determine the type of the inserted plug.

Note in alternative exemplary embodiments, blocks 410 and 430 may be interchanged in order, i.e., the switch may be closed prior to being opened.

Figure 5:
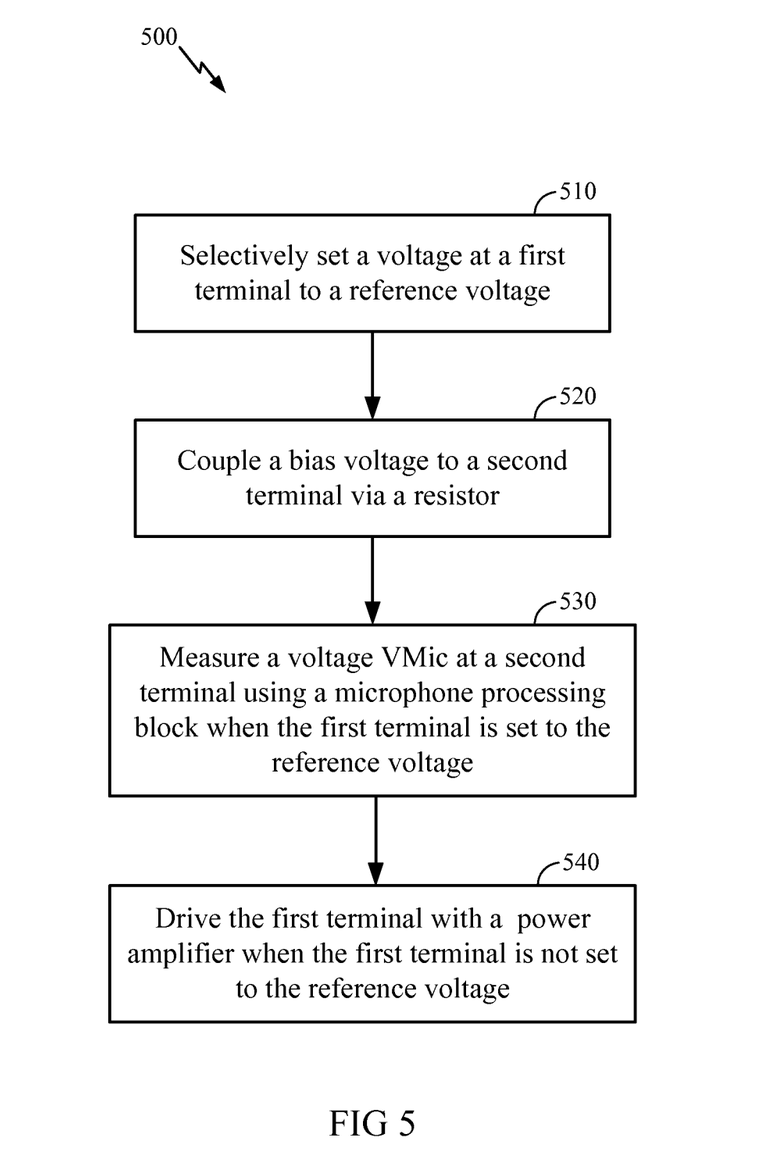
FIG. 5 illustrates an alternative exemplary embodiment of a method according to the present disclosure.

FIG. 5 illustrates an alternative exemplary embodiment of a method 500 according to the present disclosure. At block 510, a first terminal is selectively set to a reference voltage. At block 520, a bias voltage is coupled to a second terminal via a resistor. At block 530, a voltage VMic is measured at the second terminal using a microphone processing block when the first terminal is set to the reference voltage. In light of the present disclosure, the plug type may be indicated to be North American if the measured VMic exceeds a predetermined voltage threshold VTH, and may be indicated to be European otherwise. At block 540, the first terminal is driven with a power amplifier when the first terminal is not set to the reference voltage.

Figure 6:
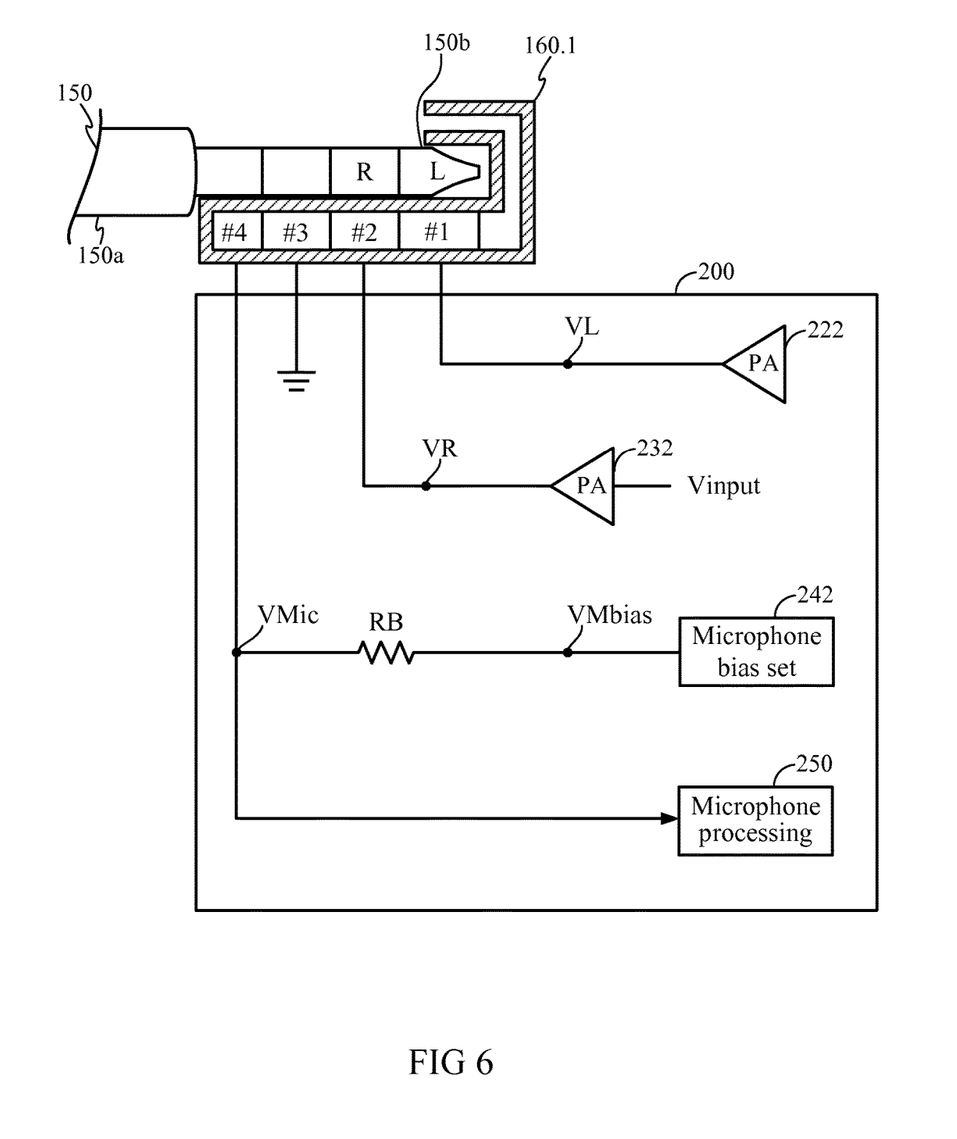
FIG. 6 illustrates an alternative exemplary embodiment wherein, instead of using a switch S1, the output voltage of the PA is directly configured by setting a PA input voltage Vinput to the input of the PA.

FIG. 6 illustrates an alternative exemplary embodiment wherein, instead of using a switch S1, the output voltage of PA 232 is directly configured by setting a PA input voltage Vinput to the input of the PA 232. In particular, to detect the plug type, the input voltage Vinput may drive the output of the PA 232 to a reference voltage VREF, achieving the same effect as if the switch S1 of FIG. 2 selectively coupled the output of the PA 232 to VREF. For the case in which the switch S1 is closed, the output of the PA 232 may simply be configured to have a high impedance, using, e.g., a control signal (not shown) coupled to the PA 232. To detect the plug type, the PA 232 may be driven using Vinput, such that the voltage VR takes on the same voltage as would be the case if the switch S1 were instead used to couple VR to a reference voltage, as shown in FIG. 2.

Figure 7:
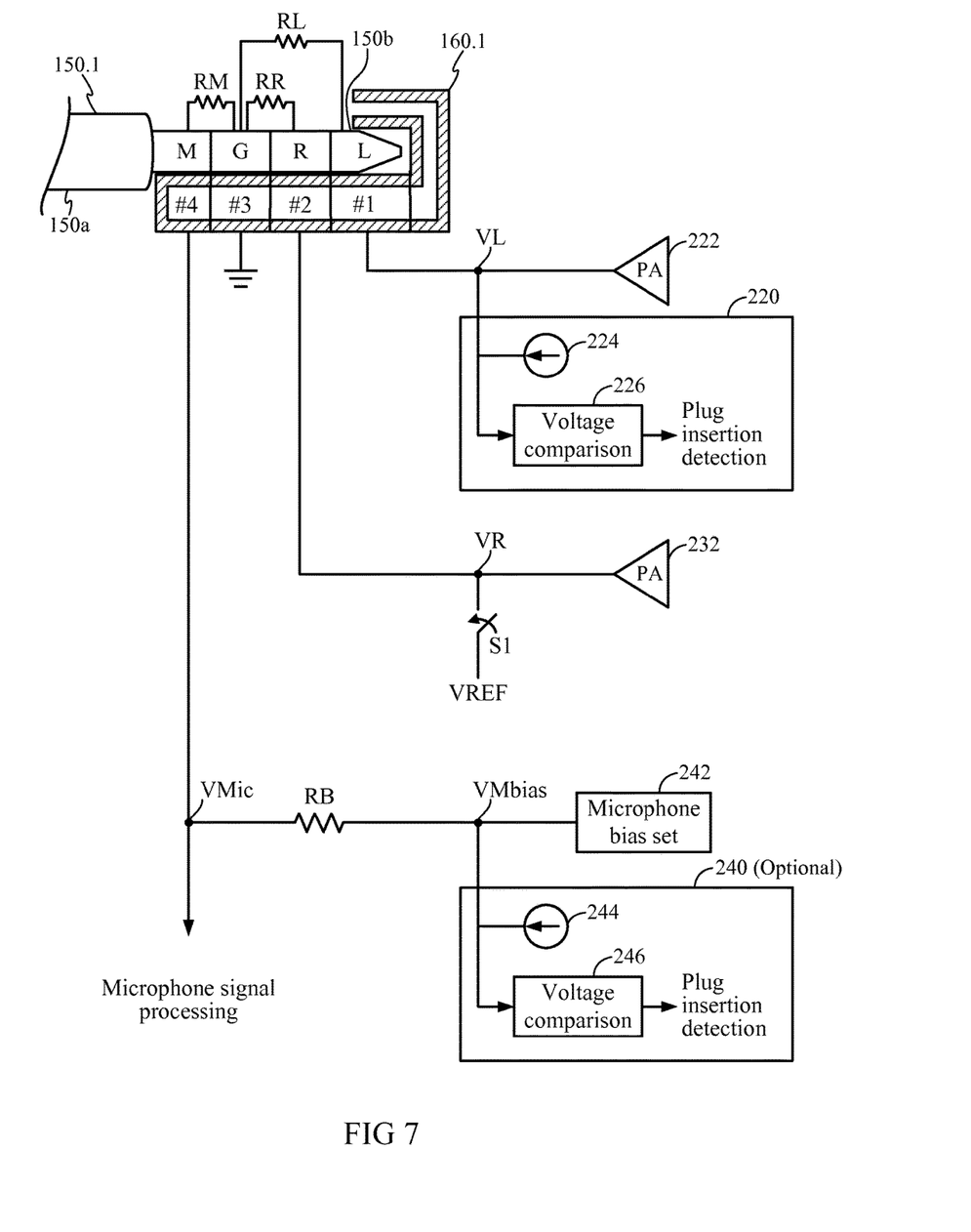
FIG. 7 illustrates an exemplary embodiment of the present disclosure wherein techniques for plug insertion detection are combined with the techniques for plug type detection described herein.

FIG. 7 illustrates an alternative exemplary embodiment of the present disclosure wherein techniques for plug insertion detection are combined with the techniques for plug type detection described herein. Note FIG. 7 is shown for illustrative purposes only, and is not meant to limit the scope of the present disclosure. In FIG. 7, elements labeled with the same numerals as in FIG. 2 will be understood to have similar functionality, unless otherwise stated.

In FIG. 7, insertion detection circuitry 220 and 240 are coupled to the voltages VL and VMbias, respectively. In an exemplary embodiment, either of the insertion detection circuitry 220 and 240 may be configured such that the outputs of the voltage comparison blocks 226 and 246 are distinct depending on whether a plug is inserted into the jack 160.1. For example, the current source 224 may pull the voltage VL higher or lower when the L terminal of plug 150.1 is coupled to terminal #1 of the jack 160.1. Similarly, the current source 244 may pull the voltage VMbias higher or lower when the M terminal of plug 150.1 is coupled to terminal #4 of the jack 160.1. Further details of the plug insertion detection scheme of FIG. 7 may be found in U.S. Provisional Pat. App. Ser. No. 61/576,868, entitled "Plug Insertion Detection," filed Dec. 16, 2011, earlier referenced herein, and in U.S. Pat. App. Ser. No. Unknown, entitled "Plug Insertion Detection," filed concurrently herewith, both assigned to the assignee of the present disclosure, the contents of which are hereby incorporated herein in their entirety. It will also be appreciated that any techniques for detecting the insertion of a media plug known in the art may be applied in conjunction with the techniques of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
   a first power amplifier having a first output coupled to a first terminal;
   a bias voltage block for generating a bias voltage coupled to a second terminal via a bias resistor; and
   a microphone processing block coupled to the second terminal, the microphone processing block configured to measure a voltage at the second terminal when a reference direct-current (DC) voltage is provided to the first output, the reference DC voltage causing the voltage at the second terminal to be different while a plug interfaces with the first and second terminals of a jack depending on a type of plug interfacing with the first and second terminals, wherein the first power amplifier is configured to drive the first terminal.

2. The apparatus of claim 1, further comprising a switch configured to selectively couple the first output to the reference DC voltage.

3. The apparatus of claim 2, the microphone processing block further configured to measure the voltage at the second terminal when the switch is open, and when the switch is closed.

4. The apparatus of claim 3, further comprising a processor configured to control the switch and store the measured voltages in a memory.

5. The apparatus of claim 4, further comprising the jack for receiving a plug, the first and second terminals being disposed on the jack, the processor further configured to determine a type of the plug as North American or European based on the measured voltage at the second terminal.

6. The apparatus of claim 5, wherein the measured voltage being substantially the same when the switch is open and closed indicates a North American type plug, and wherein the measured voltage being substantially different when the switch is open and closed indicates a European type plug.

7. The apparatus of claim 2, the switch configured to be open when the first power amplifier drives the first terminal with a signal voltage, wherein the first power amplifier is configured to drive the first terminal when the first terminal is not set to the reference DC voltage.

8. The apparatus of claim 1, wherein the reference DC voltage is provided to the first output by setting the input voltage to the first power amplifier.

9. The apparatus of claim 1, further comprising the jack, wherein the jack is configured to receive an audio plug comprising microphone, ground, right audio, and left audio terminals.

10. The apparatus of claim 9, wherein the jack is configured to receive either a European-style audio plug or a North American-style audio plug.

11. The apparatus of claim 1, further comprising:
   the jack for receiving a plug, the first and second terminals being disposed on the jack; and
   a processor configured to determine a type of the plug as North American or European based on the measurement of the voltage at the second terminal when the first output is set to the reference DC voltage.

12. The apparatus of claim 1, the reference DC voltage corresponding to a ground voltage, wherein the measured voltage being higher than ground by a predetermined voltage threshold indicates a type of the plug as North American, and wherein the measured voltage being less than the predetermined voltage threshold indicates a type of the plug as European.

13. A method comprising:
selectively setting a voltage at a first terminal to a reference voltage;
coupling a bias voltage to a second terminal via a resistor;
measuring a voltage at a second terminal using a microphone processing block when the first terminal is selectively set to the reference voltage, the reference voltage causing the voltage at the second terminal to be different while a plug interfaces with the first and second terminals of a jack depending on a type of plug interfacing with the first and second terminals; and
driving the first terminal with a power amplifier.

14. The method of claim 13, further comprising:
measuring the voltage at the second terminal when the first terminal is not set to the reference voltage, the first terminal is driven with the power amplifier when the first terminal is not set to the reference DC voltage.

15. The method of claim 14, further comprising:
storing the measured voltages in a memory;
comparing the measured voltages to each other; and
indicating a type of a plug coupled to the first and second terminals to be North American if a difference between the measured voltages is less than a predetermined voltage threshold, and European otherwise.

16. The method of claim 13, the reference voltage corresponding to a ground voltage, the method further comprising:
determining a type of a plug coupled to the first and second terminals as North American if the measured voltage is higher than ground by a predetermined voltage threshold; and
determining the type of the plug as European otherwise.

17. An apparatus comprising:
a first power amplifier having a first output coupled to a first terminal;
means for selectively setting the first output to a reference voltage;
a bias voltage block for generating a bias voltage coupled to a second terminal via a bias resistor; and
a microphone processing block coupled to the second terminal to measure the voltage at the second terminal, the reference voltage causing the voltage at the second terminal to be different while a plug interfaces with the first and second terminals of a jack depending on a type of plug interfacing with the first and second terminals, wherein the first power amplifier is configured to drive the first terminal.

18. The apparatus of claim 17, further comprising means for detecting a load coupled to a third terminal, a presence of the load at the third terminal indicating insertion of a media plug into a corresponding jack.

19. A non-transitory computer-readable storage medium comprising code for:
selectively setting a voltage at a first terminal to a reference voltage;
coupling a bias voltage to a second terminal via a resistor;
measuring a voltage at a second terminal using a microphone processing block when the first terminal is set to the reference voltage, the reference voltage causing the voltage at the second terminal to be different while a plug interfaces with the first and second terminals of a jack depending on a type of plug interfacing with the first and second terminals; and
driving the first terminal with a power amplifier.

* * * * *